United States Patent
Bashir et al.

[11] Patent Number: 6,121,148
[45] Date of Patent: Sep. 19, 2000

[54] SEMICONDUCTOR DEVICE TRENCH ISOLATION STRUCTURE WITH POLYSILICON BIAS VOLTAGE CONTACT

[75] Inventors: Rashid Bashir, Santa Clara; Wipawan Yindeepol, San Jose, both of Calif.

[73] Assignee: National Semiconductor Corporation, Santa Clara, Calif.

[21] Appl. No.: 09/236,978

[22] Filed: Jan. 26, 1999

Related U.S. Application Data

[62] Division of application No. 09/024,329, Feb. 17, 1998, Pat. No. 5,914,523.

[51] Int. Cl.⁷ .................................................. H01L 21/302
[52] U.S. Cl. ............................................................. 438/692
[58] Field of Search .................................... 438/692, 697, 438/699, 717, 723, 724, 753, 751, 243, 245, 248, 386, 388, 391

[56] References Cited

U.S. PATENT DOCUMENTS

| | | | |
|---|---|---|---|
| 5,411,913 | 5/1995 | Bashir, et al. | 437/67 |
| 5,811,315 | 9/1998 | Yindeepol et al. | 437/62 |
| 5,914,523 | 6/1999 | Bashir et al. | 257/520 |

OTHER PUBLICATIONS

Katsumata, Y., et al: *Sub–20 ps ECL Bipolar Technology with High Breakdown Voltage*, ESSDERC, pp. 133–136 (1993).

Poon, S. et al.: *A Trench Isolation Process for BiCMOS Circuits*, IEEE Bipolar circuits and Technology Meeting 3.3, pp. 45–48 (1993).

Rung, R. et al.: *Deep Trench Isolated CMOS Devices*, IDEM, vol. 82, pp. 237–240, (1982).

Yindeepol, W. et al. *Methods of Forming and Planarizing Deep Isolation Trenches in a Silicon–On–Insulator (SOI) Structure*, Co–pending U.S. application 08/816,490 filed Mar. 13, 1997.

*Primary Examiner*—William Powell
*Assistant Examiner*—George Goudreau
*Attorney, Agent, or Firm*—Limbach & Limbach LLP

[57] ABSTRACT

A semiconductor device, polysilicon-contacted trench isolation structure that provides improved electrical isolation stability, a method of operating a polysilicon-contacted trench isolated semiconductor device, and a process for manufacturing a polysilicon-contacted trench isolation structure. The trench isolation structure includes an isolation trench formed in a semiconductor substrate. The isolation trench has a layer of trench lining oxide, a layer of trench lining silicon nitride and a trench fill polysilicon (poly 1) layer. Exposed lateral surfaces of the poly 1, which extend above the trench lining silicon nitride, are contacted to another layer of polysilicon (poly 2). The method of operation includes applying a bias voltage to the trench fill poly 1 layer via poly 2. The process for manufacture includes etching an isolation trench that extends through a layer of field oxide and into a semiconductor substrate. After forming layers of trench lining oxide, trench lining silicon nitride and trench fill poly 1 in the isolation trench, the trench lining silicon nitride is etched back to expose lateral surfaces of the trench fill poly 1. A poly 2 layer is then deposited and makes contact with the exposed lateral surfaces of the trench fill poly 1.

3 Claims, 7 Drawing Sheets

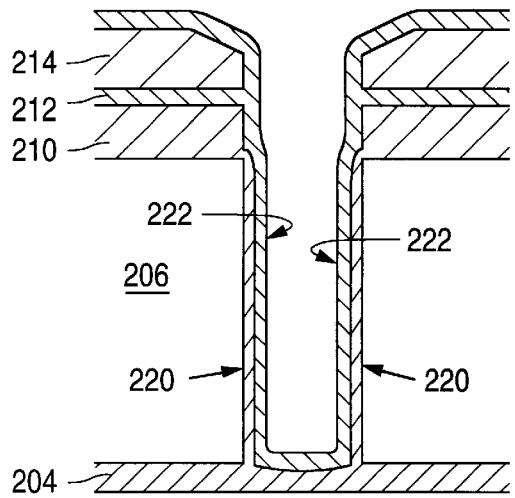
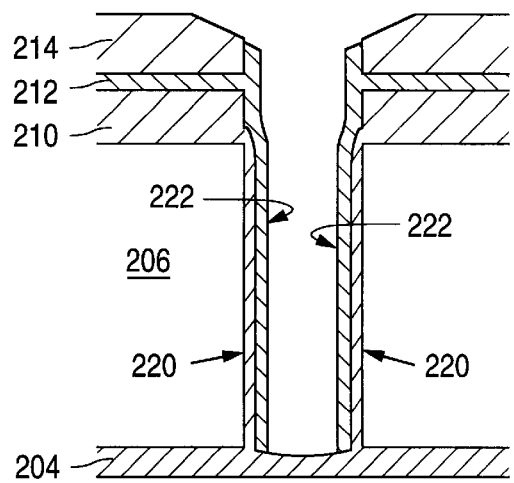
FIG. 6G  FIG. 6H
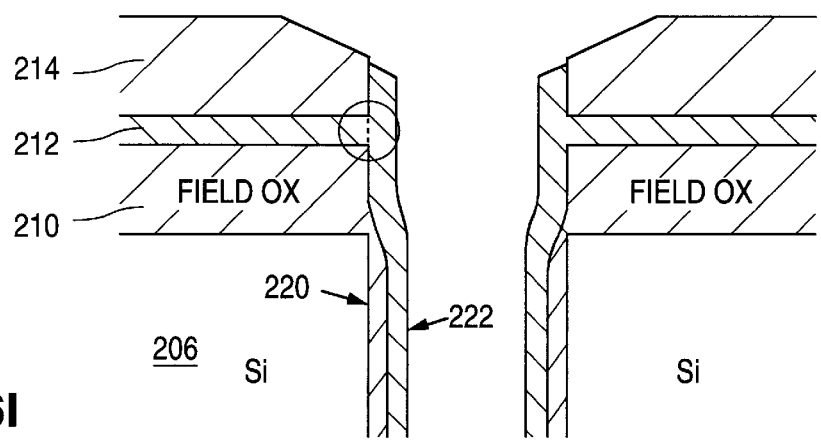
FIG. 6I
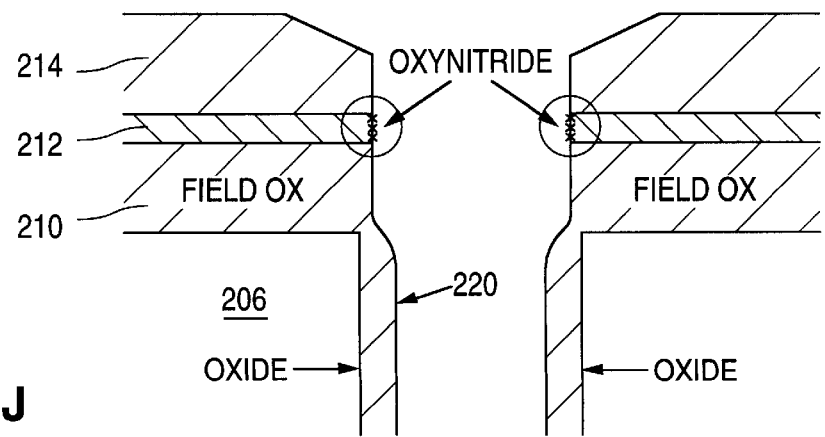
FIG. 6J

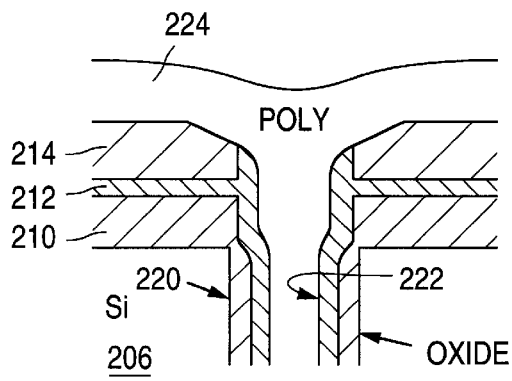
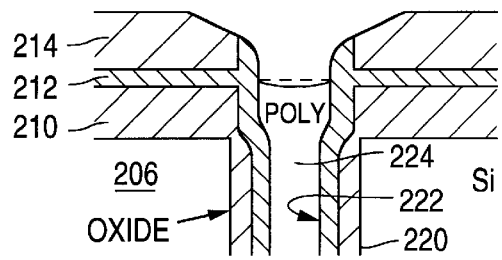
FIG. 6K        FIG. 6L
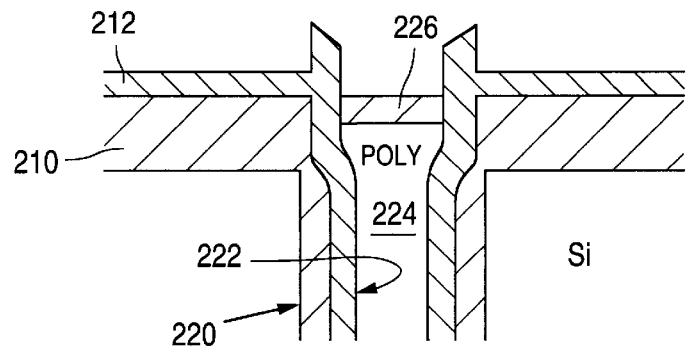
FIG. 6M
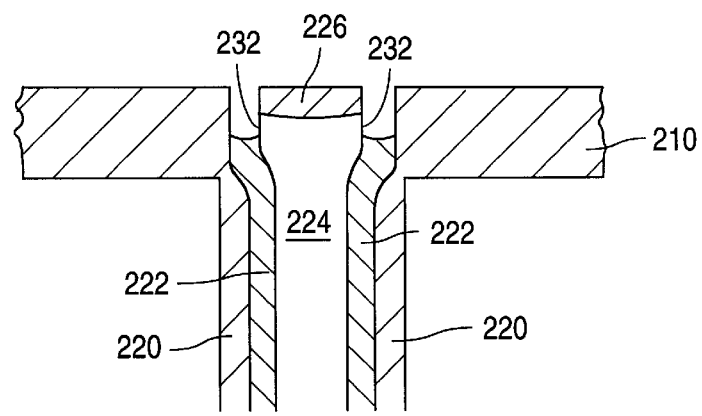
FIG. 6N

SEMICONDUCTOR DEVICE TRENCH ISOLATION STRUCTURE WITH POLYSILICON BIAS VOLTAGE CONTACT

This application is a divisional of U.S. application Ser. No. 09/024,329, filed Feb. 17, 1998, now U.S. Pat. No. 5,914,523.

BACKGROUND OF THE INVENTION

1. Field of the Invention

The present invention relates to semiconductor device trench isolation structures, processes for their manufacture and methods for their operation. In particular, the present invention pertains to polysilicon filled trench isolation structures that include a polysilicon contact for supplying a bias voltage. The trench isolation structure, as well as process of manufacture and method of operation thereof, can be used in association with complementary metal-oxide semiconductor (CMOS), bipolar, and combination bipolar and CMOS (BiCMOS) semiconductor devices.

2. Description of the Related Art

It is often desirable to electrically isolate semiconductor devices from one another in an integrated circuit. One way to accomplish such isolation is by utilizing insulator filled vertical trenches in the semiconductor substrate to circumscribe the semiconductor devices, thereby obstructing lateral electrical leakage. See, for example, S. M. Sze, *VLSI Technology*, 489–490 (2nd edition 1988). In some instances, particularly with high voltage semiconductor devices, a "buried" horizontal insulator layer in the semiconductor substrate is employed. The "buried" horizontal insulator layer is intersected with the vertical trenches to completely surround and electrically isolate the high voltage semiconductor devices.

FIG. 1 shows a cross-section of a conventional semiconductor device trench isolation structure 2 that includes a semiconductor substrate 4 and an isolation trench 6. Isolation trench 6 contains therein a multi-layered trench fill that includes a layer of trench lining oxide 8, a layer of trench lining silicon nitride 10 and trench fill polysilicon layer 12. Insulating layer 14 covers the surface of semiconductor substrate 4 and isolation trench 6 and serves to isolate trench fill polysilicon layer 12 from conductive layers deposited in subsequent processing.

FIG. 2 shows a conventional silicon-on-insulator (SOI) semiconductor device trench isolation structure that includes a base silicon substrate 16 with a buried horizontal insulator layer 18 (typically oxide) formed on its upper surface. An active silicon layer 20 is formed on the buried horizontal insulator layer 18. Isolation trench 22 extends from the surface of the active silicon layer 20 to the buried horizontal insulator layer 18, thereby completely electrically insulating a portion 24 of the active silicon layer 20 from the remainder of the structure.

Typically the isolation trench 22 includes a layer of trench lining oxide 26 (i.e. the outer layer of the isolation trench) formed on the active silicon layer sidewalls that surround the isolation trench. Isolation trench 22 may also include a layer of trench lining silicon nitride 28 (i.e. the middle layer of the isolation trench) formed over the layer of trench lining oxide 26. Trench fill polysilicon layer 30 (i.e. the innermost layer of the isolation trench) occupies the remainder of the isolation trench 22. Insulating layer 32 isolates the trench fill polysilicon layer from conductive layers deposited in later processing.

The electrical isolation provided by conventional trench isolation structures can be less than ideal. For example, it has been found, upon initial biasing of certain high voltage semiconductor devices, that the devices may pass current at a voltage less than the designed breakdown voltage. Upon continued stress and passage of current, the breakdown voltage will then "walk out" to its design breakdown voltage. This unstable electrical isolation behavior may be associated with high electric fields across conventional isolation trenches and/or avalanche breakdown at the corners of conventional trench isolation structures.

Thus, there is a need in the art for a semiconductor device trench isolation structure, a process for its manufacture and a method for its operation that provides for stable electrical isolation even under high operating voltage conditions. The semiconductor device trench isolation structure should also be relatively compact in order to avoid increasing die size.

SUMMARY OF THE INVENTION

The present invention provides a semiconductor device trench isolation structure formed in a semiconductor substrate (e.g. a silicon substrate or a silicon-on-insulator [SOI] substrate). The semiconductor device trench isolation structure includes a field oxide (FOX) layer on the surface of the semiconductor substrate and an isolation trench which extends vertically through the FOX layer and into the semiconductor substrate. Because of this structural arrangement of the isolation trench, the isolation trench has both semiconductor substrate sidewalls and FOX sidewalls.

The isolation trench has multiple layers. There is a layer of trench lining oxide as the outer layer of the isolation trench that directly interfaces with the semiconductor substrate sidewalls, and a layer of trench lining silicon nitride (i.e. the middle layer) formed over the lateral layer of trench lining oxide and on a lower portion of the FOX sidewalls. A trench fill polysilicon (poly 1) layer occupies the remainder of the isolation trench as the innermost layer. The trench fill poly 1 layer extends above the layer of trench lining silicon nitride such that an upper lateral surface of the trench fill poly 1 layer is free from contact with the layer of trench lining silicon nitride. Another layer of polysilicon (poly 2) contacts the trench fill poly 1 layer at the upper lateral surface of the trench fill poly 1 layer. Since the poly 2 layer contact to the trench fill poly 1 layer is centered over the isolation trench, with minimal extension beyond the isolation trench, the die size remains relatively compact.

In one embodiment, the poly 2 layer also makes contact to a semiconductor device (CMOS, bipolar, or BiCMOS) that is formed in the semiconductor substrate and circumscribed by the isolation trench. In another embodiment, the isolation trench intersects a buried horizontal insulator layer (typically oxide) formed in the semiconductor substrate, while the poly 2 layer makes contact with the base and emitter of an NPN bipolar transistor in addition to the trench fill poly 1 layer.

The present invention also provides a method for operating a polysilicon-contacted trench isolated semiconductor device. The method includes first providing a polysilicon-contacted trench isolated semiconductor device in a semiconductor substrate. This trench isolated semiconductor device includes a FOX layer on the surface of the semiconductor substrate and an isolation trench that extends vertically through the FOX layer and into the semiconductor substrate. The structure of the isolation trench is identical to the semiconductor device trench isolation structure of the present invention described above. Next, a bias voltage signal is applied to the trench fill poly 1 layer via the poly 2 layer. This bias voltage signal is of a sufficient magnitude to maintain an electric field across the isolation trench below a predetermined value, which is low enough to ensure stable electrical isolation under all operating conditions.

The present invention also provides a process for forming a polysilicon-contacted isolation trench in a semiconductor substrate. In the process according to the present invention, an oxide/nitride/oxide (ONO) layer is first formed on the semiconductor substrate. This ONO layer is composed of a FOX layer, a layer of low-pressure chemical vapor deposition (LPCVD) silicon nitride and a layer of deposited hardmask oxide (e.g. LTO or TEOS).

A photoresist layer is then coated on the ONO layer and patterned. All three components of the ONO layer (i.e. deposited hardmask oxide, LPCVD silicon nitride and FOX) are anisotropically etched using the patterned photoresist layer as a mask to expose a desired portion of the surface of the semiconductor substrate, thereby forming an upper portion of the isolation trench.

The patterned photoresist layer is subsequently removed and the deposited hardmask oxide is used as a mask for anisotropically etching the exposed portion of the semiconductor substrate to construct the remainder of the isolation trench. The isolation trench so constructed vertically extends through the FOX and into the semiconductor substrate and, therefore, includes both FOX sidewalls and semiconductor substrate sidewalls.

Next, a layer of trench lining oxide is formed over the semiconductor substrate sidewalls of the isolation trench. A layer of trench lining silicon nitride is subsequently deposited (e.g. by LPCVD) on the layer of trench lining oxide, the ONO layer and the FOX sidewalls. Thereafter, an anisotropic etch removes the layer of trench lining silicon nitride from all horizontal surfaces (i.e. the bottom of the isolation trench and the horizontal surfaces of the ONO layer), while the layer of trench lining silicon nitride on the vertical surfaces (i.e. the vertical surfaces of the ONO layer, including the FOX sidewall, and the layer of trench lining oxide) remains unaffected.

Next, a trench fill polysilicon (poly 1) layer is deposited to fill the remainder of the isolation trench and then etched back to remove the trench fill poly 1 layer from the top of the deposited hardmask oxide layer. The deposited hardmask oxide layer is subsequently removed.

Next, the layer of LPCVD silicon nitride is removed, together with an upper portion of the layer of trench lining silicon nitride that is sufficient to expose an upper portion of the lateral surface of the trench fill poly 1 layer. Another layer of polysilicon (poly 2) is then deposited over the FOX layer and trench fill poly 1 layer such that the poly 2 layer makes contact with the exposed lateral surface of the trench fill poly 1 layer. Finally, the poly 2 layer is doped and patterned.

In one embodiment of the process according to the present invention, the polysilicon-contacted isolation trench is formed in a silicon-on-insulator (SOI) structure, which includes a base semiconductor substrate, a buried horizontal insulator layer formed on the base semiconductor substrate, and an active silicon layer formed on the buried horizontal insulator layer. The active silicon layer is anisotropically etched such that the resultant isolation trench extends down to the buried horizontal insulator layer.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings, of which.

DETAILED DESCRIPTION

Figure 1:
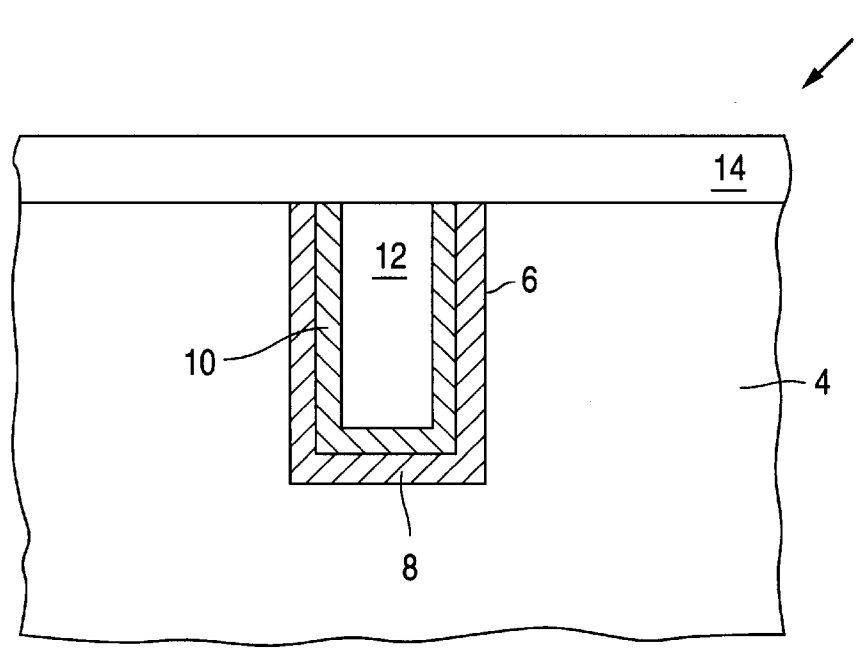
FIG. 1 is a cross-sectional view illustrating a conventional isolation trench structure.
Figure 2:
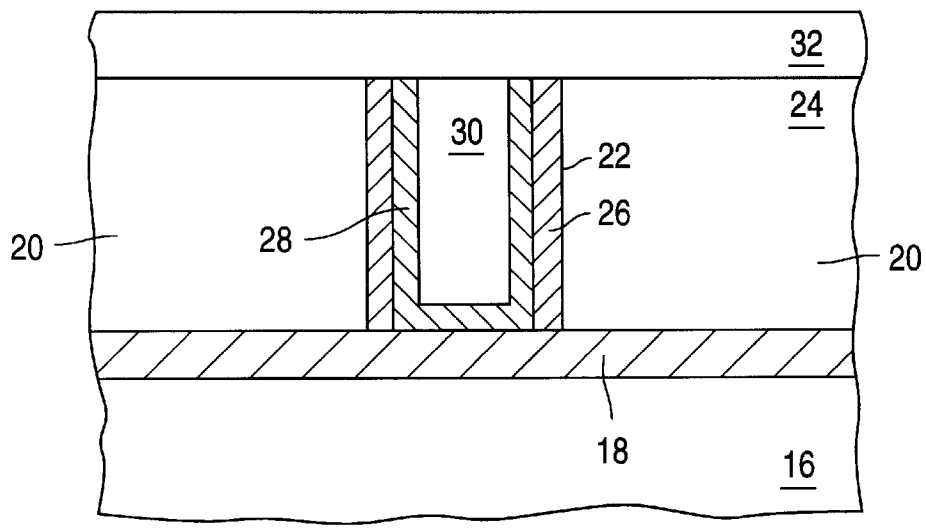
FIG. 2 is a cross-sectional view depicting a conventional isolation trench structure that intersects with a buried horizontal insulator layer.
Figure 3:
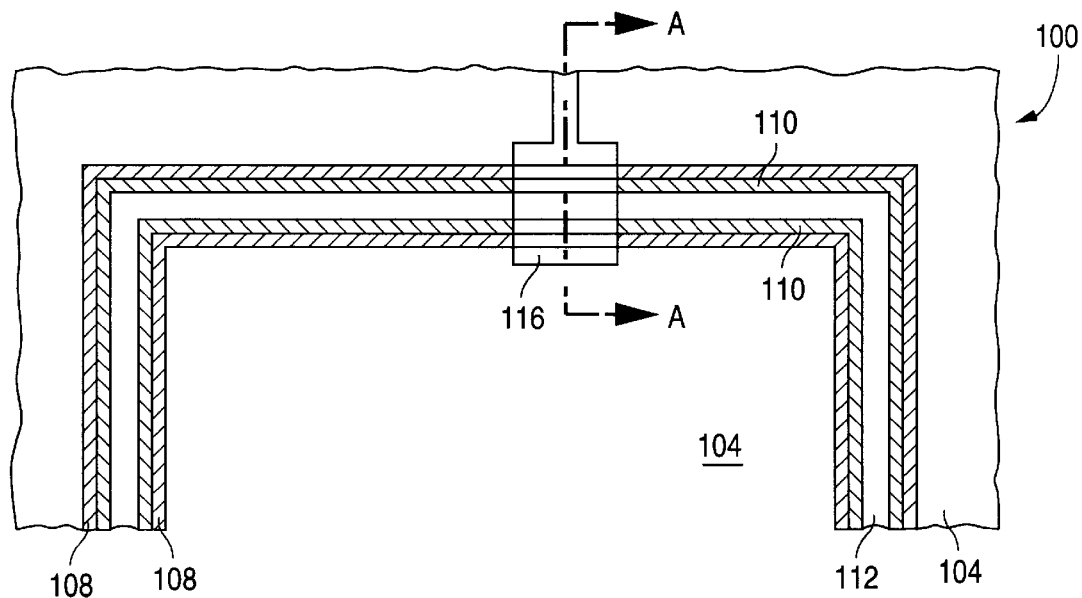
FIG. 3 is a layout showing a semiconductor device trench isolation structure in accordance with the present invention.
Figure 4:
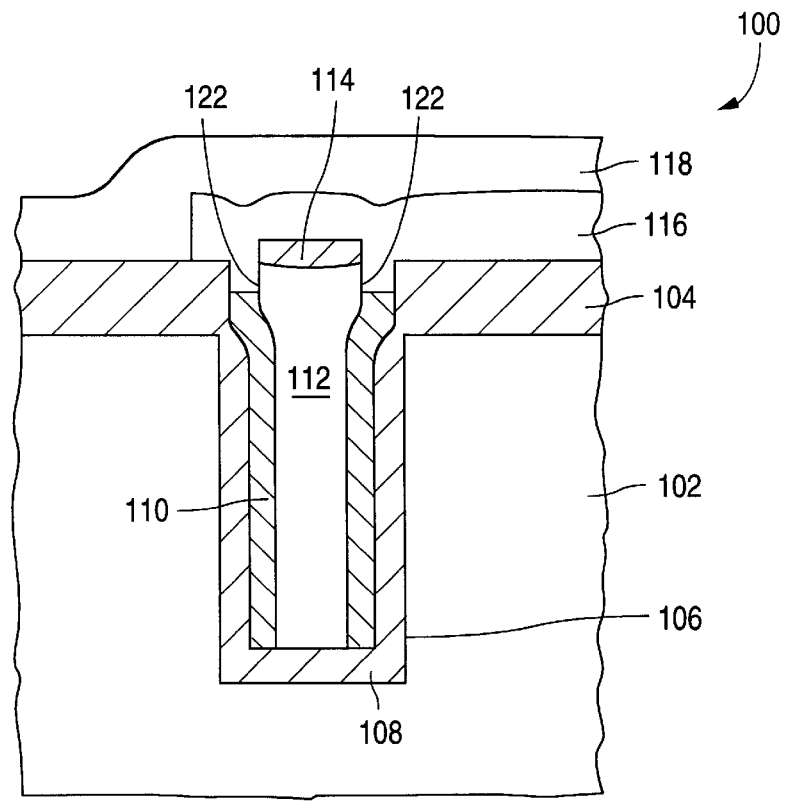
FIG. 4 is a cross-sectional view, along line A—A of FIG. 3, illustrating a semiconductor device trench isolation structure in accordance with the present invention.

FIGS. 3 and 4 illustrate, in layout and cross-sectional views respectively, a semiconductor device trench isolation structure 100. The structure 100 includes a semiconductor substrate 102, a FOX layer 104 on the surface of the semiconductor substrate 102 and an isolation trench 106 which vertically extends through the FOX layer 104 and into the semiconductor substrate 102. The isolation trench 106, therefore, directly interfaces with semiconductor substrate sidewalls and FOX sidewalls.

The isolation trench 106 has multiple layers, including a layer of trench lining oxide 108 (i.e. an outer layer) disposed over the semiconductor substrate sidewalls of the isolation trench 106, and a layer of trench lining silicon nitride 110 (i.e. a middle layer) disposed on the lateral layer of trench lining oxide 106 and on a bottom portion of the FOX sidewalls of the isolation trench.

A trench fill polysilicon (poly 1) layer 112 occupies the reminder of the isolation trench 106 as an innermost layer. The trench fill poly 1 layer 112 overlies and extends above the layer of trench lining silicon nitride 110 such that an upper portion of a lateral surface 122 of the trench fill poly 1 layer 112 is free from contact with the layer of trench lining silicon nitride 110. An oxide cap 114 (not shown in FIG. 3) covers the top surface of the trench fill poly 1 layer 112.

The structure 100 also includes another layer of polysilicon (poly 2) 116 contacting the trench fill poly 1 layer where the upper portion of the lateral surface 122 of the trench fill poly 1 layer 112 extends above the layer of trench lining silicon nitride 110. The poly 2 layer also overlies at least a portion of the FOX layer 104. Insulating layer 118 (not shown in FIG. 3) covers the FOX layer 104 and poly 2 layer 116.

In order to ensure a robust electrical contact between the poly 2 layer and trench fill poly 1 layer, it is preferred that the poly 2 layer contact the trench fill poly 1 layer along a lateral surface of the trench fill poly 1 layer that is between 0.2 and 0.5 microns in height.

Figure 5:
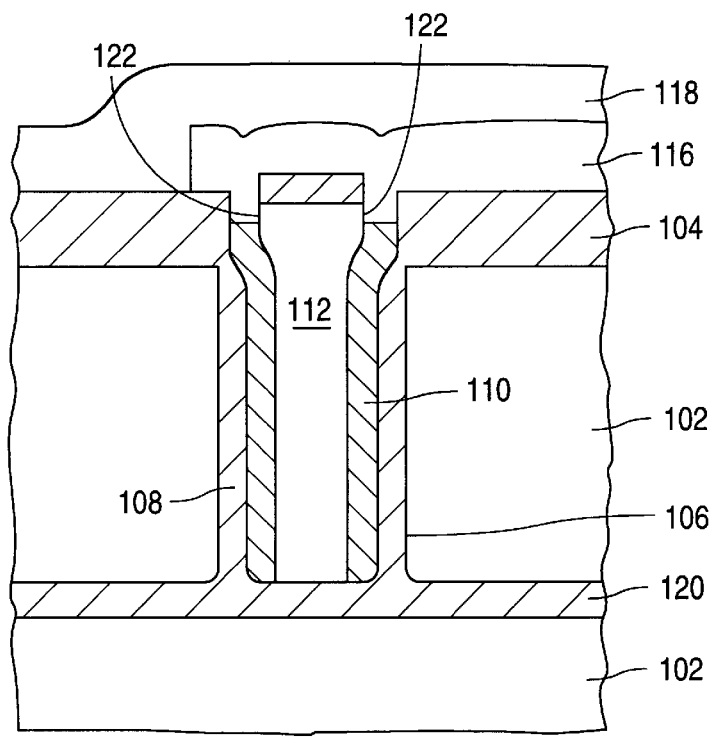
FIG. 5 is a cross-sectional view depicting a semiconductor device trench isolation structure in accordance with the present invention that includes a buried horizontal insulator layer that intersects the isolation trench.

FIG. 5 is a cross-sectional view of one embodiment of the semiconductor device trench isolation structure in accordance with the present invention that is similar to that of FIGS. 3 and 4, but also includes a horizontal buried insulator layer (e.g. silicon dioxide) 120 in the semiconductor substrate 102. In this embodiment, the isolation trench 106 directly intersects the buried horizontal insulator layer 120.

CMOS, bipolar or BiCMOS semiconductor devices can be formed in the semiconductor substrate such that the devices are either circumscribed by the isolation trench or, when a buried horizontal insulator layer is present, completely surrounded by the isolation trench and intersecting buried horizontal insulator layer. In one embodiment, a bipolar device is formed in the semiconductor substrate and the poly 2 layer is used to make contact to the bipolar device's base and emitter.

A method of operating the polysilicon-contacted trench isolated semiconductor device structures of FIGS. 3–5 would include the step of supplying a bias voltage sufficient to maintain an electric field across the isolation trench below a predetermined value. The bias voltage is applied to the trench fill poly 1 layer via the poly 2 layer. By maintaining a predetermined electric field across the isolation trench, electrical isolation instability due to high electrical fields across the isolation trench and/or avalanche breakdown at the trench corners can be eliminated.

In one embodiment of the method of operation according to the present invention, an NPN bipolar transistor is provided in the semiconductor substrate and a bias voltage signal is applied to the trench fill poly 1 layer via the poly 2 layer, that is equal to or more positive than the most positive potential seen at the NPN bipolar transistor collector terminal during operation of the NPN bipolar transistor. For operating high voltage NPN bipolar transistors circumscribed by 2.0 micron isolation trenches in accordance with the present invention, the applied voltage signal can be, for example, at least +40 volts.

Figure 6A:
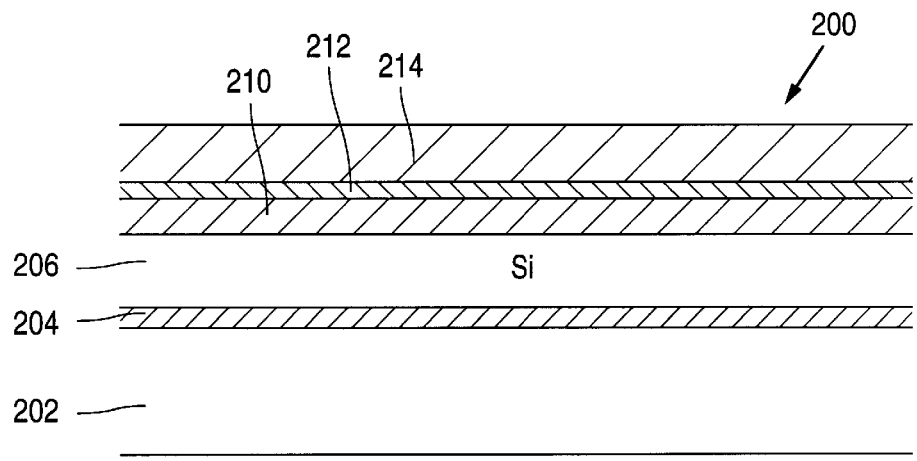
FIGS. 6A–6Q are cross-sectional views showing a sequence of process steps for forming a polysilicon-contacted trench isolation structure in an SOI structure in accordance with an embodiment of the present invention.
Figure 6B:
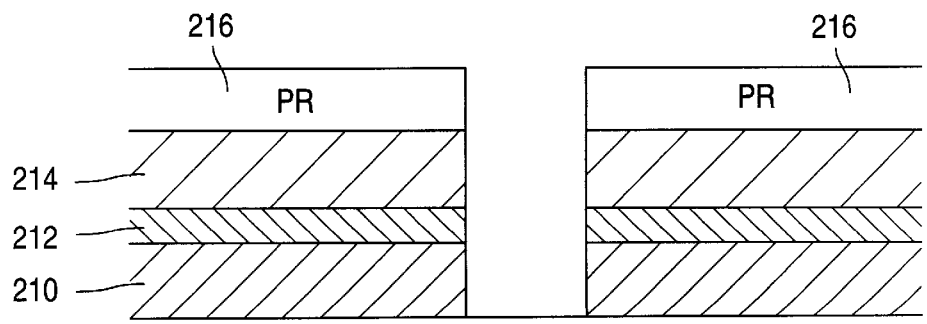
Figure 6C:
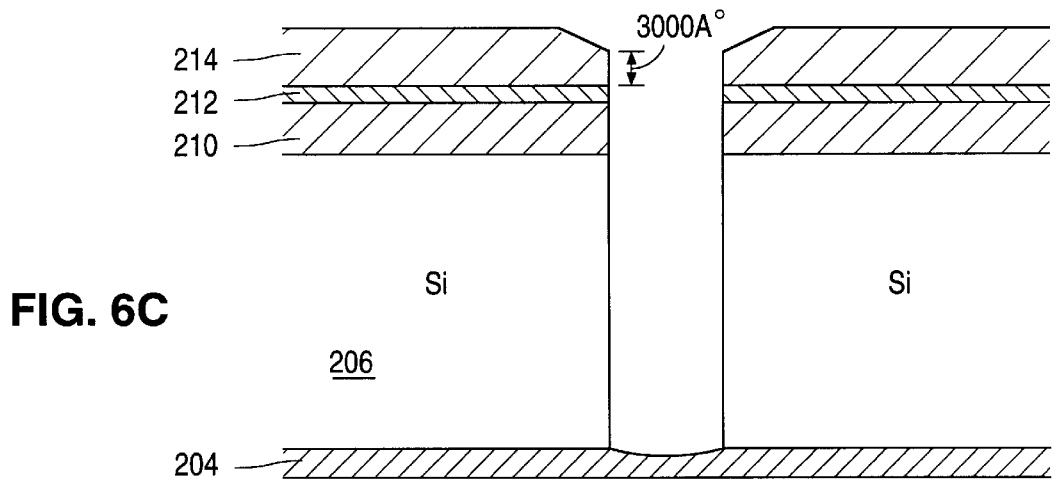
Figures 6D, 6E:
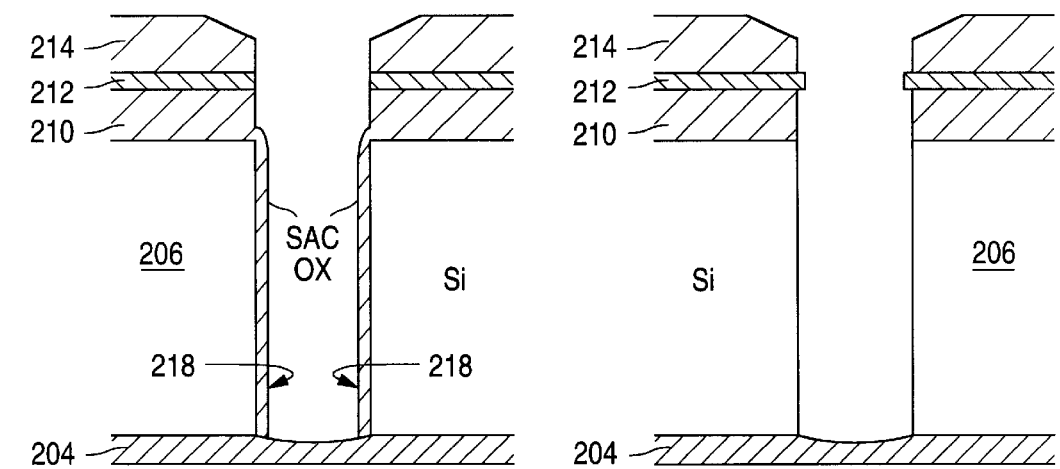
Figure 6F:
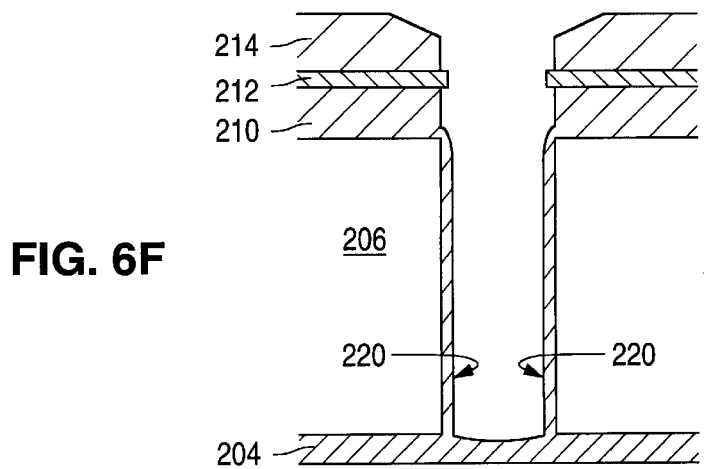
Figure 6O:
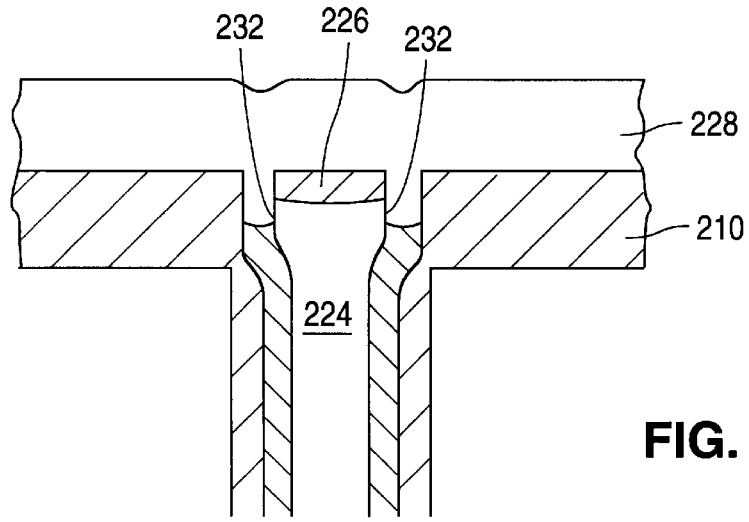
Figure 6P:
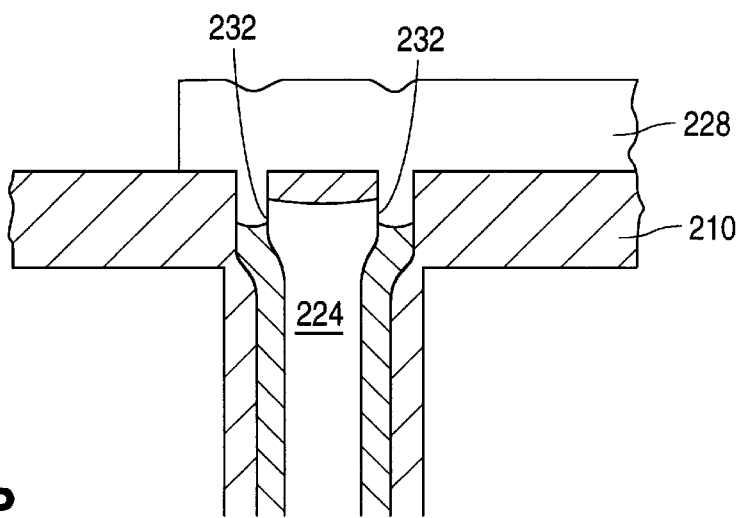
Figure 6Q:
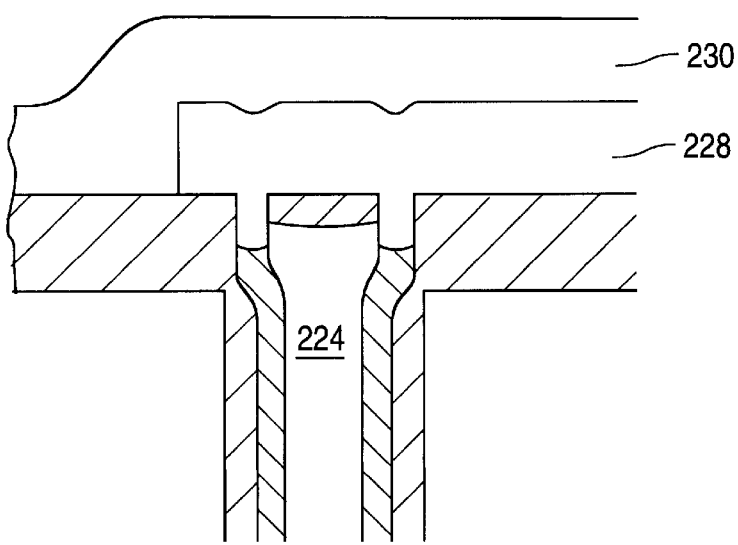

FIGS. 6A–6Q illustrate various stages of a process for constructing a polysilicon-contacted trench isolation structure according to the present invention.

FIG. 6A shows a precursor SOI structure 200 that includes a base semiconductor substrate 202, a buried horizontal insulator layer 204 (typically silicon dioxide) formed on the base semiconductor substrate 202, and an active silicon layer 206 (typically about 20,000–25,000 Å thick) formed on buried horizontal insulator layer 204. The active silicon layer 206 can include an epitaxial layer grown on bonded silicon.

FIG. 6A also illustrates a FOX layer 210 (about 10,000 Å thick and grown by local oxidation of silicon [WOCOS]), formed on the active silicon layer 206, a layer of LPCVD silicon nitride 212 (about 2,000–3,000 Å thick) formed on the FOX layer 210 and a layer of deposited hardmask oxide 214 (e.g. LTO or TEOS; about 25,000–29,000 Å thick) formed on the layer of LPCVD silicon nitride 212. These three layers (layers 210, 212 and 214) constitute an oxide-nitride-oxide (ONO) layer on the active silicon layer 206.

A photoresist (PR) layer 216 is then coated on the layer of deposited hardmask oxide 214 and patterned. The thickness of the photoresist layer 216 is about 2–3 microns, sufficient to withstand a conventional dry etch of the ONO layer. Using the patterned photoresist layer 216 as an etch mask, the layer of deposited hardmask oxide 214, layer of LPCVD silicon nitride 212 and FOX layer 210 are then etched, thereby exposing an upper surface of the active silicon layer 206 and lateral surfaces of FOX (precursors to the FOX sidewalls of the isolation trench discussed below). The resultant structure is shown in FIG. 6B. The etch chemistry utilized here is selective so that it etches the ONO layer, without substantially etching or damaging the active silicon layer 206.

After removal of the patterned photoresist layer 216, the active silicon layer 206 is anisotropically etched ("trench etch step") to construct trenches therein that extend to the buried horizontal insulator layer 204, as shown in FIG. 6C. The trenches are approximately 2 microns wide.

The initial thickness of the layer of deposited hardmask oxide 214 (approx. 25,000–29,000 Å) is chosen such that, after the trench etch step, at least a portion of the opening in the layer of deposited hardmask oxide 214 (approx. 3,000 Å) remains vertical (i.e. unetched), as shown in FIG. 6C.

Referring to FIG. 6D, in one embodiment, after the trench etch step, a thin layer of sacrificial oxide 218 (about 600–700 Å thick) is grown at high temperature along the active silicon layer sidewalls of the isolation trench to consume any damage in the active silicon layer 206 resulting from the trench etch step. The thin layer of sacrificial oxide 218 is then removed (i.e. the damage to the active silicon layer 206 is removed) by, for example, dipping in a hydrofluoric acid (HF) or buffered HF acid solution, resulting in the structure shown in FIG. 6E.

A layer of trench lining oxide 220 with a thickness in the range of about 1000–5000 Å is then grown on the active silicon layer sidewalls of the isolation trench at a temperature between about 950° C. and 1150° C., resulting in the structure illustrated in FIG. 6F. A layer of trench lining silicon nitride 222 (about 3,000 Å thick) is subsequently deposited to cover the layer of deposited hardmask oxide 214, lateral surface of the layer of LPCVD silicon nitride, the FOX sidewalls, the layer of trench lining oxide and the buried horizontal insulator layer 204 at the bottom of the isolation trench.

This layer of LPCVD silicon nitride 212 and the layer of trench lining silicon nitride 222 are then anisotropically etched, using an etcher with selectivity between the trench lining nitride 222 and underlying buried horizontal insulator layer 204. During this etch, only horizontally exposed portions of the layer of LPCVD silicon nitride 212 (i.e. the top of the layer of deposited hardmask oxide 214) and the layer of trench lining silicon nitride 222 (i.e. at the bottom of the isolation trench) are removed, while vertically exposed portions thereof (i.e. those on lateral surfaces of the layer of deposited hardmask oxide 214, LPCVD silicon nitride trench, the FOX sidewalls, and the layer of trench lining oxide 220) are unaffected, as shown in FIG. 6H.

The layer of LPCVD silicon nitride 212 functions as an etch barrier to protect the underlying FOX layer 210 so that the thickness of the FOX layer 210 remains constant and uniform, during removal of the remaining layer of deposited hardmask oxide 214 after formation of the isolation trench.

Referring to FIG. 6I, the importance of the anisotropic nature of the etch with respect to the layer of trench lining silicon nitride 222 is to ensure that there is an adequate post-etch thickness of the layer of trench lining silicon nitride 222 remaining above the layer of LPCVD silicon nitride 212 so that a robust interface between these two nitride layers can be maintained. To facilitate this, as discussed above, it is important to have an adequate portion of the opening in the layer of deposited hardmask oxide 214 remain vertical after the trench etch. Thus, the initial thickness of the layer of deposited hardmask oxide 214 is chosen based upon the selectivity of the trench etch to the deposited hardmask oxide and the amount of facet formation on the deposited hardmask oxide at the opening.

Furthermore, robust merger of the interface between the layer of LPCVD silicon nitride 212 and the layer of trench lining silicon nitride 222 can be ensured by dipping the structure in HF or BOE, before deposition of the layer of trench lining silicon nitride 222. The dipping removes any oxynitride (see FIG. 6J), formed during the formation of the layer of trench lining oxide 220, on a lateral exposed surface of the layer of LPCVD silicon nitride that would otherwise interfere with such merger.

After etching the layer of trench lining silicon nitride 222, the remainder of the isolation trench is filled with a trench fill polysilicon (poly 1) layer 224 by LPCVD. The thickness of the trench fill poly 1 layer 224 is selected to ensure that the trench fill poly 1 layer 224 completely fills (i.e. occupies) the isolation trench, including at the corners where the diagonal distance is approximately 2.8 microns. The resulting structure is shown in FIG. 6K.

The trench fill poly 1 layer 224 is then etched back to remove the trench fill poly 1 layer 224 from the surface of the layer of deposited hardmask oxide 214. This etch back is performed using, for example, an isotropic or anisotropic etcher with either a F-based or $Cl_2$-based etch chemistry. The etch back uses an endpoint detection system and adds a poly 1 overetch so that, as illustrated on FIG. 6L, the trench fill poly 1 layer 224 remaining in the isolation trench is at a level such that a subsequent oxidation of the trench fill poly 1 layer 224 produces an oxide cap 226 that is planar with the FOX layer 210.

The remaining layer of deposited hardmask oxide 214 is then removed using a hardmask strip solution. Since the layer of deposited hardmask oxide 214 is relatively thick and, thus, the structure is immersed in the hardmask strip solution for a relatively long time to complete removal, the robust interface between the layer of LPCVD silicon nitride 212 and the layer of trench lining silicon nitride 222 discussed above is important.

The upper surface of trench fill poly 1 layer 224 is then oxidized to form an oxide cap 226 on the top part of thereof, as shown in FIG. 6M. The oxide cap 226 functions as an etch-stop layer upon removal of the poly 2 layer from section of the isolation trench where there is no poly 2 contact. This allows die size to remain compact.

Next the layer of LPCVD silicon nitride 212 and a portion of the-layer of trench lining silicon nitride 222 are etched using, for example, hot phosphoric acid. During this etch, the layer of LPCVD silicon nitride 212 is completely removed, while the layer of trench lining silicon nitride 222 is etched back to a point such that at least 0.2 microns of an upper lateral surface 232 of the trench fill poly 1 layer 224 is exposed. The resultant structure is depicted in FIG. 6N. A more preferable exposure length of the trench fill poly 1 layer is between 0.2 and 0.5 microns.

Another layer of polysilicon (poly 2, about 3500 Å thick) 228 is subsequently deposited. As shown in FIG. 6O, the poly 2 layer covers surfaces of the FOX layer 210, the exposed upper lateral surface 232 of the trench fill poly 1 layer 224 and the oxide cap 226. The poly 2 layer 228 therefore makes electrical contact to the trench fill poly 1 layer 224 through its exposed upper lateral surface 232. The contacting of the poly 2 layer with the trench fill poly 1 layer in accordance with the present invention is "self-aligned" since no additional photolithography masking and etch steps are required to expose the upper lateral surface of the trench fill poly 1 layer prior to deposition of the poly 2 layer.

Those skilled in the art will, however, recognize that between the step of etching back the layer of trench lining silicon nitride 222 and the step of depositing poly 2 layer 228, additional processing steps may be performed to form, for example, portions or all of a bipolar, CMOS or BiCMOS device in the active silicon layer 206. When desired, the trench isolation structure can be protected during these additional steps by use of a photoresist mask, temporary deposited oxide layer or other techniques known in the art.

Next the poly 2 layer 228 is doped, for example, by ion implantation, and patterned using conventional photolithographic and etching techniques. The resultant cross-sectional structure is shown in FIG. 6P, while the layout of its surface is equivalent to that of FIG. 3.

Finally, an insulating layer 230 (e.g. 7000 Å of LTO) is deposited. The resultant structure is illustrated in FIG. 6Q and is equivalent to that shown in FIG. S.

Alternative trench formation processes are described in a co-pending U.S. patent application titled "Methods of Forming and Planarizing Deep Isolation Trenches in a Silicon-On-Insulator (SOI) Structure," application Ser. No. 08/816, 408, filed Mar. 13, 1997, which is incorporated herein in its entirety by reference.

It should be understood that various alternatives to the embodiments of the invention described herein may be employed in practicing the invention. It is intended that the following claims define the scope of the invention and that processes and structures within the scope of these claims and their equivalents by covered thereby.

What is claimed is:

1. A method for forming a polysilicon-contacted trench isolation structure comprising the steps of:

providing a semiconductor substrate;

forming an oxide/nitride/oxide (ONO) layer on the semiconductor substrate, the ONO layer including: a field oxide (FOX) layer formed on the semiconductor substrate, a layer of LPCVD silicon nitride formed on the FOX layer and a layer of deposited hardmask oxide formed on the layer of LPCVD silicon nitride;

coating a photoresist layer on the ONO layer;

patterning the photoresist layer;

etching the ONO layer, using the patterned photoresist layer as an etch mask, to expose a portion of the surface of the semiconductor substrate;

removing the patterned photoresist layer;

etching the exposed portion of the surface of the semiconductor substrate, thereby forming an isolation trench extending through the FOX layer and into the semiconductor substrate, the isolation trench having FOX sidewalls and semiconductor substrate sidewalls;

forming a layer of trench lining oxide on the semiconductor substrate sidewalls;

depositing a layer of trench lining silicon nitride on the layer of trench lining oxide, on the FOX sidewalls, on a bottom of the isolation trench, and on the ONO layer;

anisotropically etching the layer of trench lining silicon nitride to remove the layer of trench lining nitride from horizontal surfaces of the ONO layer and from the bottom of the isolation trench;

depositing a trench fill polysilicon (poly 1) layer to fill the isolation trench;

etching the trench fill poly 1 layer from a top of the deposited hardmask oxide;

removing the layer of deposited hardmask oxide;

etching the layer of LPCVD silicon nitride and the layer of trench lining silicon nitride to remove the layer of LPCVD silicon nitride and to expose an upper lateral surface of the trench fill poly 1 layer in the isolation trench;

depositing another polysilicon (poly 2) layer over the FOX layer and the exposed upper lateral surface of the trench fill poly 1 layer, the poly 2 layer thereby making contact to the trench fill poly 1 layer; and doping the poly 2 layer.

2. The method of claim 1, wherein the step of providing a semiconductor substrate includes the step of providing a silicon-on-insulator (SOI) structure semiconductor substrate, the SOI structure semiconductor substrate including a base semiconductor substrate, a buried horizontal insulator layer formed on the base semiconductor substrate, and an active silicon layer formed on the buried horizontal insulator layer;

the step of etching the ONO layer includes etching the ONO layer to expose a portion of a surface of the active silicon layer; and the step of etching the exposed portion of the surface of the semiconductor substrate includes etching the exposed portion of the surface of the active silicon layer to form a trench in the active silicon layer extending to the buried horizontal insulator layer.

3. The method of claim 1, wherein the step of etching the layer of LPCVD silicon nitride and the layer of trench lining silicon nitride exposes an upper lateral surface of the trench fill poly 1 layer, the upper lateral surface having a height of between 0.2 and 0.5 microns.

* * * * *